(12) United States Patent
Barnes et al.

(10) Patent No.: US 7,351,657 B2
(45) Date of Patent: Apr. 1, 2008

(54) METHOD AND APPARATUS FOR APPLYING EXTERNAL COATING TO GRID ARRAY PACKAGES FOR INCREASED RELIABILITY AND PERFORMANCE

(75) Inventors: David A. Barnes, Palm Harbor, FL (US); Jason C. Grooms, St. Petersburg, FL (US); Neal B. Martinez, Maderia Beach, FL (US); Joseph M. McKinnerney, Tampa, FL (US)

(73) Assignee: Honeywell International Inc., Morristown, NJ (US)

( * ) Notice: Subject to any disclaimer, the term of this patent is extended or adjusted under 35 U.S.C. 154(b) by 83 days.

(21) Appl. No.: 11/150,450

(22) Filed: Jun. 10, 2005

(65) Prior Publication Data

US 2006/0278971 A1 Dec. 14, 2006

(51) Int. Cl.
*H01L 21/44* (2006.01)
(52) U.S. Cl. .................. 438/679; 438/51; 438/106
(58) Field of Classification Search ................ 438/679, 438/694, 695, 51, 106; 257/E33.06, E31.119, 257/E23.077, E23.116
See application file for complete search history.

(56) References Cited

U.S. PATENT DOCUMENTS 6,316,285 B1 * 11/2001 Jiang et al. .................. 438/106

(Continued)

FOREIGN PATENT DOCUMENTS

DE 10105351 8/2002
DE 10318074 12/2004

*Primary Examiner*—Thao P. Le
(74) *Attorney, Agent, or Firm*—Fogg & Powers LLC

(57) ABSTRACT

A method and apparatus are disclosed for selective removal of a conformal coating from the solder balls of grid array packages such that the benefits of the coating are realized. An ancillary benefit of the invention is improved processability of the grid array package by improving the mechanical containment of the solder during the reflow process and improved electrical isolation between the individual solder attachment points. For example, a method for coating a ball grid array is provided, which includes coating the ball grid array with a thin layer of parylene. Next, the solder ball side of the part is butter smeared or squeegeed with a water soluble coating and assembled wet. A mask having holes in the same pattern as the balls in the grid, and a thickness that is about 80% of the height of the balls, is applied to the solder ball side of the part. This side of the part is then butter smeared again with the water soluble coating, and the entire assembly is allowed to dry. At this point, about 20% of each parylene-coated solder ball protrudes higher than the surface of the mask. The solder ball side of the part is then grit blasted with an abrasive material. The extent that the abrasive material removes the parylene coating from the solder balls is limited by the mask and the layer of water soluble coating. Therefore, the grit blasting removes the parylene coating from only the protruding areas (e.g., about top 20%) of the solder balls. Water is then used to remove the water soluble coating, and the parylene coated part is baked to remove moisture. Thus, a parylene coated ball grid array (or column grid array) is provided that is highly impervious to moisture, has a very high dielectric strength, and thereby improves the electrical performance and reliability of the surface mounted part.

8 Claims, 3 Drawing Sheets

U.S. PATENT DOCUMENTS 6,908,784 B1 * 6/2005 Farnworth et al. .......... 438/106
7,060,526 B2 * 6/2006 Farnworth et al. .......... 438/106
2002/0119396 A1 * 8/2002 Jiang et al. .................. 430/311
2004/0203187 A1 10/2004 Sekiya et al.

* cited by examiner

METHOD AND APPARATUS FOR APPLYING EXTERNAL COATING TO GRID ARRAY PACKAGES FOR INCREASED RELIABILITY AND PERFORMANCE

FIELD OF THE INVENTION

The invention relates generally to the electronic circuit packaging field, and more specifically, but not exclusively, to a method and apparatus for increasing the reliability and performance of surface mount packages used for integrated circuits. More specifically, the invention relates to a method and apparatus for selective removal of a conformal coating from the solder balls of grid array packages such that the benefits of the coating are realized. An ancillary benefit of the invention is improved process-ability of the grid array package, by improving the mechanical containment of the solder during the reflow process and improved electrical isolation between the individual solder attachment points.

BACKGROUND OF THE INVENTION

A grid array package is a type of surface mount package used for integrated circuits. Two generic types of grid array packages are most common: ball grid arrays in which a small solder ball is used as the joining interface; and column grid arrays in which a cylindrical column of solder is used as the joining interface. In a typical ball grid array, balls or beads of solder are affixed to one face of the package in a grid pattern. The package is placed on a printed circuit board, which has tin- or solder-coated copper pads arranged in a pattern that matches the grid pattern of the solder balls. The solder balls are used to conduct electrical signals to and from an integrated circuit mounted in the package to the printed circuit board. When the solder is heated to a liquid state, the solder from the solder balls alloy with the material on the corresponding Printed Wiring Board (PWB) pads to effect a metallurgical and electrical bond. While the solder is in the liquid state, the surface tension of the molten solder holds the package in alignment with the printed circuit board and maintains separation from its neighbors while the solder cools and solidifies.

Grid array packages have numerous and significant advantages over other surface mount packages (e.g., leaded packages) for integrated circuits. For example, ball grid arrays can have much higher pin counts (generally 100 or more pins) per given area than prior packages and allow for higher packaging densities. Furthermore, due to the very short distances between their packages and the printed circuit boards, ball grid arrays have much lower thermal resistances and inductances than leaded packages. Thus, ball grid arrays provide much higher heat dissipation and electrical performance than prior surface mounted or other types of packages for integrated circuits.

Notwithstanding the distinct advantages of grid array packages, they are still prone to some of the same environmental sensitivities as their leaded counterparts (primarily moisture, radiation and heat). In addition, grid array packages tend to be more susceptible to contamination entrapment and solder bridging due to the close spacing and confined area in which the solder attachments are formed. However, due to the performance, cost and processing advantages of grid array packages, they are now entering the realm of high reliability electronic products. For example, the National Aeronautics and Space Administration (NASA) has approved the use of grid arrays as surface mount packages for integrated circuits in very long space missions with high reliability requirements. In an effort to further reduce cost, manufacturers have employed the use of plastic and polymeric materials in the outer packaging materials for grid array packages. This results in packages that are more susceptible to moisture and humidity than their ceramic counterparts. For this reason, plastic packages often require special handling, processing and storage conditions. In addition, high reliability applications may also have additional requirements that plastic packages have difficulty achieving. These requirements include radiation resistance, dielectric strength, out-gassing, off-gassing, flammability and atomic oxygen resistance that limit the choice of plastic materials that can be used for ball grid arrays. In order to help meet these special mission requirements, plastic grid array packages can be externally coated with a material such as parylene, to afford additional protection against these environments, that either minimize the special handling, processing and storage needs, or impart additional capabilities to the coated parts. Unfortunately, these coatings are typically applied after the part has been placed on the board, resulting in a difficult rework process if the part fails, and special handling and storage during the board build process. For this reason, development of a part-level coating process, that provides the required protection at the part level, and still allows for preliminary test and subsequent installation of the part, will reduce cost and improve reliability. Unfortunately, grid array packages are extremely difficult to coat in a truly conformal coating fashion at the part level due to the difficulty in isolating the individual grid array pads from the coating process.

Parylene is a polymer material of uniform thickness, which is often used for conformal coating of components with sharp edges, points, flat surfaces, crevices or exposed internal surfaces, uniformly and without voids. Parylene is applied using a molecular vapor deposition process in which heated molecules of the parylene dimmer are vaporized and deposited on the cooler substrate surfaces, resulting in a completely conformal coating. Parylene has an extremely high dielectric strength, a very low permeability to moisture and gases, virtually zero out-gassing, can withstand a wide temperature range, high radiation resistance, and provides a benign nonconductive, low stress coating for sensitive electronic circuitry (among other advantages). Thus, parylene is an excellent choice for conformal coating of grid array packages. However, a drawback of the use of parylene for coating grid array packages is the difficulty in achieving a coating-free condition on the solder attachment surfaces (given their relatively small size and tight spacing).

As a result, grid array packages are commonly coated after they have been soldered in place on the PWB. This technique results in: a) the need to apply special handling, processing and storage requirements for the grid array packages during the build process to prevent moisture uptake from the environment and cleaning processes; b.) problems in obtaining a fully coated grid array surface due to the limited access of the grid array surface in the installed configuration; and c.) a rather involved and risky rework process to remove parts that fail during subsequent test and integration operations. Therefore, it would be advantageous to have a solution to this existing problem of coating grid array and similar types of packages for integrated circuits at the individual part level. As described in detail below, the present invention provides an improved method and apparatus that resolves this existing problem and other similar problems.

SUMMARY OF THE INVENTION

The present invention provides a method and apparatus for selective removal of a conformal coating from the solder balls of grid array packages such that the benefits of the coating are realized. An ancillary benefit of the invention is improved process-ability of the grid array package by improving the mechanical containment of the solder during the reflow process and improved electrical isolation between the individual solder attachment points. In accordance with a preferred embodiment of the present invention, a method for coating a ball grid array is provided, which includes coating the entire external surface of the package with a thin layer of parylene. Next, the solder ball side of the part is butter smeared or squeegeed with a water soluble coating and assembled wet. A mask having holes in the same pattern as the balls in the grid, and a thickness that is about 80% of the height of the balls, is applied to the solder ball side of the part. This side of the part is then butter smeared again with the water soluble coating, and the entire assembly is allowed to dry. At this point, about 20% of each parylene-coated solder ball protrudes higher than the surface of the mask. The solder ball side of the part is then grit blasted with an abrasive material. The extent that the abrasive material removes the parylene coating from the solder balls is limited by the mask and the layer of water soluble coating. Therefore, the grit blasting removes the parylene coating from only the protruding areas (e.g., about top 20%) of the solder balls. Water is then used to remove the water soluble coating, and the parylene coated part is baked to remove moisture. Thus, in accordance with the principles of the present invention, a parylene coated ball grid array (or column grid array) package is provided that is solderable using standard soldering processes, highly impervious to moisture, has a very high dielectric strength, and thereby improves the electrical performance and reliability of the surface mounted part.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
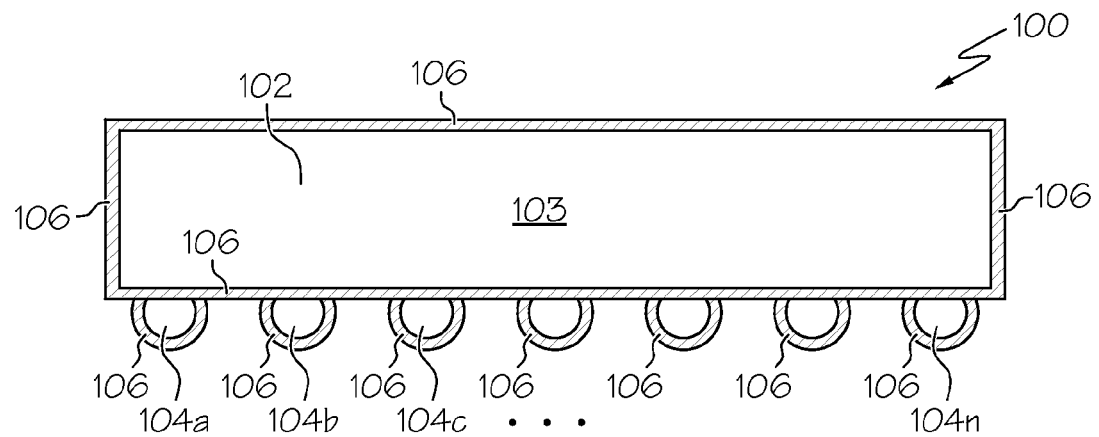
FIG. 1 depicts a pictorial representation of a cut-away side view of a parylene-coated ball grid array surface mount package, which illustrates a preferred embodiment of the present invention.

With reference now to the figures, FIG. 1 depicts a pictorial representation of a cut-away side view of an example surface mount package 100, which illustrates a method that can be used for coating a ball grid array in accordance with a preferred embodiment of the present invention. Notably, a surface mount package (100) including a plastic ball grid array package is shown in FIG. 1 for illustrative purposes, but the present invention is not intended to be so limited and can include within its scope other types of grid array packages (e.g., ceramic ball grid arrays, column ceramic ball grid arrays, flip-chip plastic ball grid arrays, etc.) or other surface mount packages, which can be coated with parylene or any other suitable material (e.g., other polymer material) having electrical and thermal properties similar to or as advantageous as parylene. For this example embodiment, surface mount package 100 includes a ball grid array package 102, an integrated circuit (denoted generally as 103) mounted on a substrate that is electrically connected to a first surface of ball grid array package 102, and a plastic cover package material (not shown) for the integrated circuit, the substrate and the first surface of ball grid array package 102. The second surface of ball grid array package 102 includes a plurality of solder balls 104a-104n (e.g., where n is equal to the total number of solder balls) arranged in a grid or array pattern. Note that the components shown in FIG. 1 are not drawn to scale and have been enlarged for clarity and ease of understanding. Also, as indicated by the shaded regions denoted as 106, the entire external surface of ball grid array package 102, including the ball grid array solder balls 104a-104n, is covered with a coating of parylene. However, it should be understood that the present invention is not intended to be so limited, and can also include covering just a pertinent portion of the surface mount package 100 (e.g., just the second surface of the ball grid array package 102 and the solder balls 104a-104n) with a coating of parylene. For this example embodiment, this coating of parylene has been selected with a typical conformal coating thickness of approximately 1 mil (e.g., between ½ mil and 2 mils thick).

Figure 2:
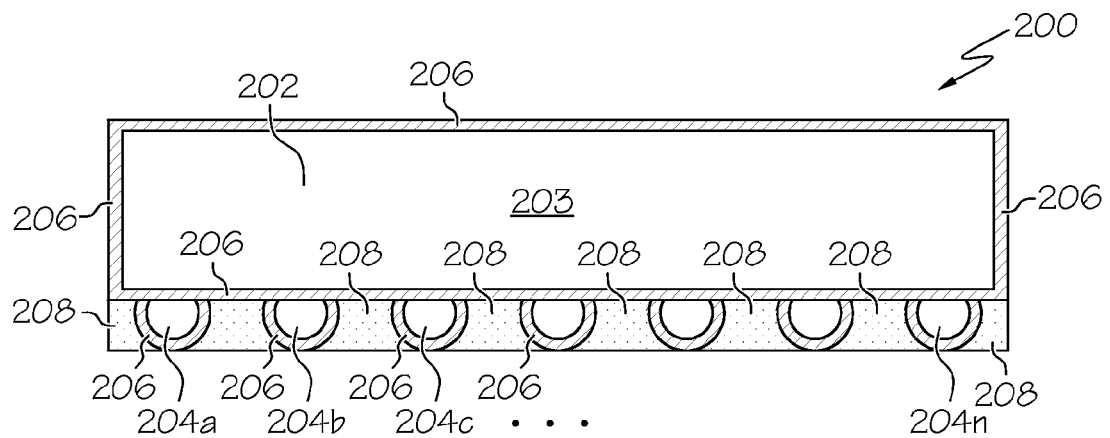
FIG. 2 depicts a pictorial representation of a cut-away side view of the parylene-coated ball grid array surface mount package depicted in FIG. 1, in which a water soluble polymeric sealant has been applied to the ball grid array surface of the package, in accordance with a preferred embodiment of the present invention.

FIG. 2 depicts a pictorial representation of a cut-away side view of a second example surface mount package 200, which further illustrates a method that can be used for coating a ball grid array (or column grid array) in accordance with a preferred embodiment of the present invention. Similar to package 100 shown in FIG. 1, for this example embodiment, surface mount package 200 includes a ball grid array package 202, an integrated circuit (denoted generally as 203) mounted on a first surface of ball grid array package 202, and a plastic cover package material (not shown) for the integrated circuit and the first surface of ball grid array package 202. Also similar to FIG. 1, the second surface of ball grid array package 202 includes a plurality of solder balls 204a-204n (e.g., where n is equal to the total number of solder balls) arranged in a grid or array pattern, and as indicated by the shaded areas denoted as 206, the entire external surface of ball grid array package 202 including solder balls 204a-204n is coated with parylene. However, surface mount package 200 in FIG. 2 differs from surface mount package 100 in FIG. 1 to the extent that surface mount package 200 in FIG. 2 includes a water soluble coating or maskant 208 applied (e.g., squeegeed on) to the parylene-coated solder ball surface of ball grid array package 202.

Figure 3:
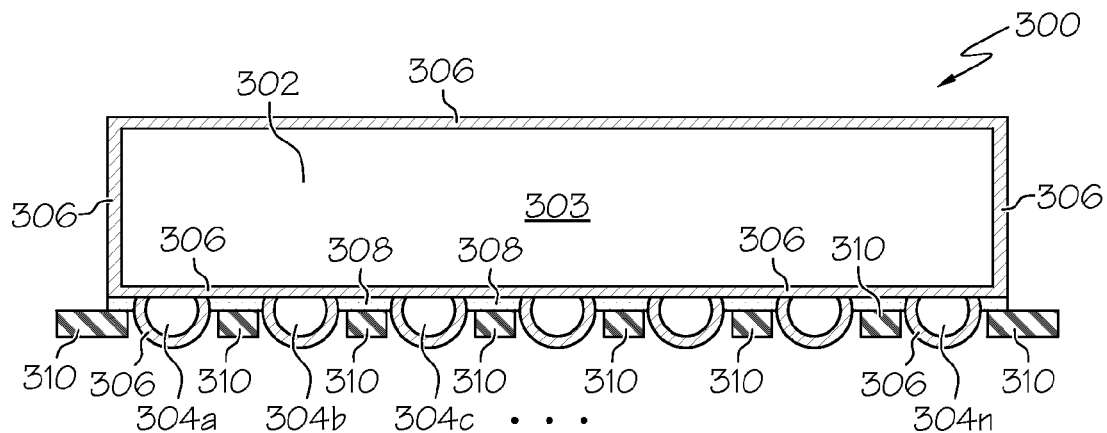
FIG. 3 depicts a pictorial representation of a cut-away side view of the parylene-coated ball grid array surface mount package depicted in FIG. 2, in which a metal mask has been applied on top of the water soluble polymeric sealant, in accordance with a preferred embodiment of the present invention.

FIG. 3 depicts a pictorial representation of a cut-away side view of a third example surface mount package 300, which further illustrates a method that can be used for coating a ball grid array (or column grid array) in accordance with a preferred embodiment of the present invention. Similar to surface mount packages 100 and 200 shown in FIGS. 1-2, for this example embodiment, surface mount package 300 includes a ball grid array package 302, an integrated circuit (denoted generally as 303) mounted on a first surface of ball grid array package 302, and a plastic cover package material (not shown) for the integrated circuit and the first surface of ball grid array package 302. Also similar to FIGS. 1-2, the second surface of ball grid array package 302 includes a plurality of solder balls 304a-304n (e.g., where n is equal to the total number of solder balls) arranged in a grid or array pattern, and as indicated by the shaded areas denoted as 306, the entire external surface of ball grid array package 302 including solder balls 304a-304n is coated with parylene. Also, surface mount package 300 includes the water soluble coating 308 applied to the parylene-coated solder ball surface of ball grid array package 302. However, surface mount package 300 in FIG. 3 differs from surface mount packages 100 and 200 in FIGS. 1-2 to the extent that surface mount package 300 in FIG. 3 includes a mask or template 310 applied to the parylene-coated solder ball surface of ball grid array package 302. For this example embodiment, the mask 310 is made of a metal material (e.g., brass), the holes in mask 310 have substantially the same pattern as the balls (or columns) in the grid, and the thickness of mask 310 has been selected to be approximately 80% of the height of the solder balls 304a-304n. Also, for this example embodiment, the diameters of the holes in mask 310 have been selected to be approximately 0.005-0.010 inch larger than the diameters (on average) of the solder balls. These slightly larger diameters for the holes may be provided in order to compensate for any minor irregularities encountered in the alignment of the mask, or differences in the sizes of the solder balls.

Figure 4:
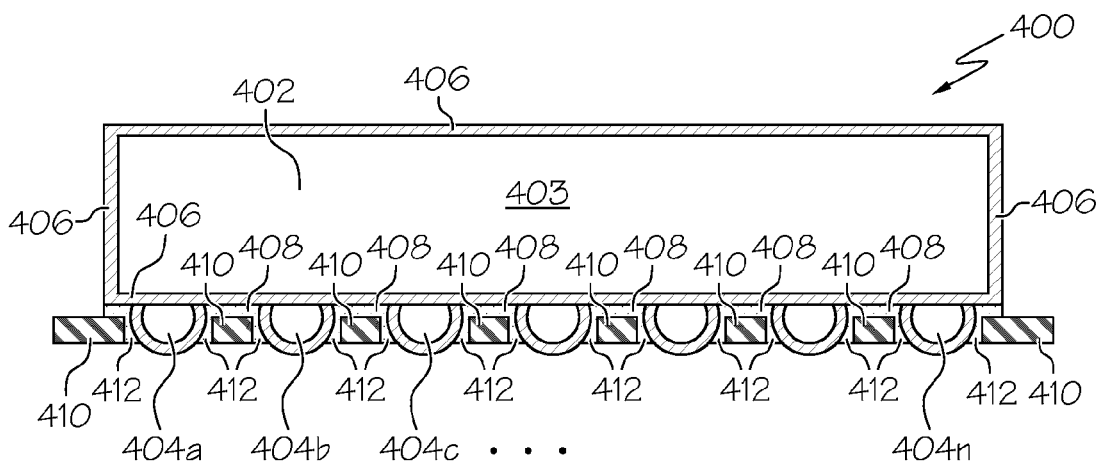
FIG. 4 depicts a pictorial representation of a cut-away side view of the parylene-coated ball grid array surface mount package depicted in FIG. 3, in which a second layer of water soluble polymeric sealant has been applied over the solder balls and the metal mask, in accordance with a preferred embodiment of the present invention.

FIG. 4 depicts a pictorial representation of a cut-away side view of a fourth example surface mount package 400, which further illustrates a method that can be used for coating a ball grid array (or column grid array) in accordance with a preferred embodiment of the present invention. Similar to surface mount packages 100, 200 and 300 shown in FIGS. 1-3, for this example embodiment, surface mount package 400 includes a ball grid array package 402, an integrated circuit (denoted generally as 403) mounted on a first surface of ball grid array package 402, and a plastic cover package (not shown) for the integrated circuit and the first surface of ball grid array package 402. Also similar to FIGS. 1-3, the second surface of ball grid array 402 includes a plurality of solder balls 404a-404n (e.g., where n is equal to the total number of solder balls) arranged in a grid or array pattern. Also, surface mount package 400 in FIG. 4 is similar to surface mount package 300 in FIG. 3 to the extent that ball grid array package 400 in FIG. 4 includes a mask or template 410 applied to the parylene-coated solder ball surface of ball grid array package 402, and also a water soluble coating 408 applied between mask 410 and the parylene-coated solder ball surface of ball grid array package 402. Again, for this example embodiment, the holes in mask 410 have substantially the same pattern as the balls in the grid, the thickness of mask 410 has been selected to be approximately 80% of the height of the solder balls 404a-404n, and the diameters of the holes in mask 410 are approximately 0.005-0.010 inch larger than the diameters (on average) of the solder balls. However, in accordance with the principles of the present invention, surface mount package 400 shown in FIG. 4 differs from surface mount packages 100, 200 and 300 in FIGS. 1-3 to the extent that a second water soluble coating or maskant 412 has been applied (e.g., squeegeed on) to the outer surface of mask 410.

Figure 5:
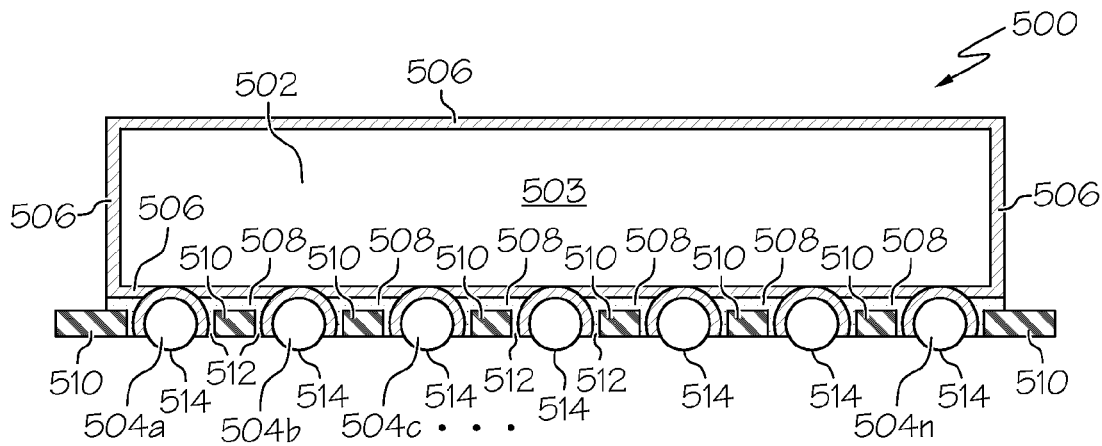
FIG. 5 depicts a pictorial representation of a cut-away view of the parylene-coated ball grid array surface mount package depicted in FIG. 4, in which the protruding surface of the ball grid array has been exposed after abrasive blasting thus removing the top-most layer of water soluble polymeric sealant and parylene coating in these areas, in accordance with a preferred embodiment of the present invention.

FIG. 5 depicts a pictorial representation of a cut-away side view of a fifth example surface mount package 500, which further illustrates a method that can be used for coating a ball grid array (or column grid array) in accordance with a preferred embodiment of the present invention. Similar to surface mount packages 100, 200, 300 and 400 shown in FIGS. 1-4, for this example embodiment, surface mount package 500 includes a ball grid array package 502, an integrated circuit (denoted generally as 503) mounted on a first surface of ball grid array package 502, and a plastic cover package (not shown) for the integrated circuit and the first surface of ball grid array package 502. Also similar to FIGS. 1-4, the second surface of ball grid array package 502 includes a plurality of solder balls 504a-504n (e.g., where n is equal to the total number of solder balls) arranged in a grid or array pattern. Also, surface mount package 500 in FIG. 5 is similar to surface mount package 400 in FIG. 4 to the extent that surface mount package 500 in FIG. 5 includes a mask or template 510 applied to the parylene-coated solder ball surface of ball grid array package 502, a water soluble coating 508 applied between mask 510 and the parylene-coated solder ball surface of ball grid array package 502, and a second water soluble coating 512 applied to the outer surface of mask 510. Again, for this example embodiment, the holes in mask 510 have substantially the same pattern as the balls in the grid, the thickness of mask 510 has been selected to be approximately 80% of the height of the solder balls 504a-504n, and the diameters of the holes in mask 510 are approximately 0.005-0.010 inch larger than the diameters (on average) of the solder balls. Importantly however, in accordance with the principles of the present invention, surface mount package 500 shown in FIG. 5 differs from the surface mount packages shown in FIGS. 1-4, to the extent that the protruding or outermost 20% (approximately) of each of the solder balls 504a-504n in FIG. 5 is not coated with parylene or any other material, as indicated by the areas denoted as 514. In other words, except for the parylene-coated areas of the solder balls 504a-504n, which are covered and protected by mask 510 and the water soluble coatings 508, 512 (e.g., approximately 80% of the area of each solder ball), the parylene coating has been removed. Thus, in accordance with a method of practicing the present invention, which is described in detail below, the parylene coating on approximately 20% of the outermost surface of each solder ball 504a-504n shown in FIG. 5 has been removed, and the remainder of the part is successfully parylene-coated.

Figure 6:
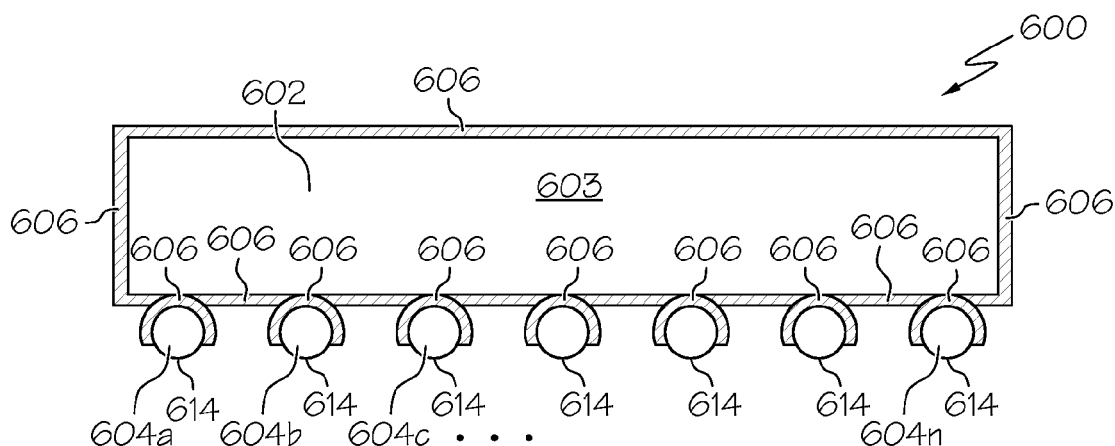
FIG. 6 depicts a pictorial representation of a cut-away view of the parylene-coated ball grid array surface mount package depicted in FIG. 5, in which the water soluble coatings and the metal mask have been removed, in accordance with a preferred embodiment of the present invention.

FIG. 6 depicts a pictorial representation of a cut-away side view of a sixth example surface mount package 600, which further illustrates a method that can be used for coating a ball grid array (or column grid array) in accordance with a preferred embodiment of the present invention. Essentially, surface mount package 600 represents a completed part that has been coated with parylene except for approximately 20% of the outermost surface of each solder ball. Specifically, similar to packages 100-500 shown in FIGS. 1-5, for this example embodiment, surface mount package 600 includes a ball grid array package 602, an integrated circuit (denoted generally as 603) mounted on a first surface of ball grid array package 602, and a plastic cover package (not shown) for the integrated circuit and the first surface of ball grid array package 602. Also similar to FIGS. 1-5, the second surface of ball grid array package 602 includes a plurality of solder balls 604a-604n (e.g., where n is equal to the total number of solder balls) arranged in a grid or array pattern. However, in accordance with the principles of the present invention, surface mount package 600 shown in FIG. 6 differs from the surface mount package 500 shown in FIG. 5, to the extent that the mask or template (e.g., mask or template 510 in FIG. 5) and the two water soluble coatings (e.g., water soluble coatings 508, 512 in FIG. 5) have been removed. Thus, surface mount package 600 represents a completed part that has been coated with parylene (e.g., as indicated by the areas denoted as 606), except for the outermost 20% (approximately) of each of the solder balls 604a-604n that is not coated with parylene or any other material (e.g., as indicated by the areas denoted as 614).

Figure 7:
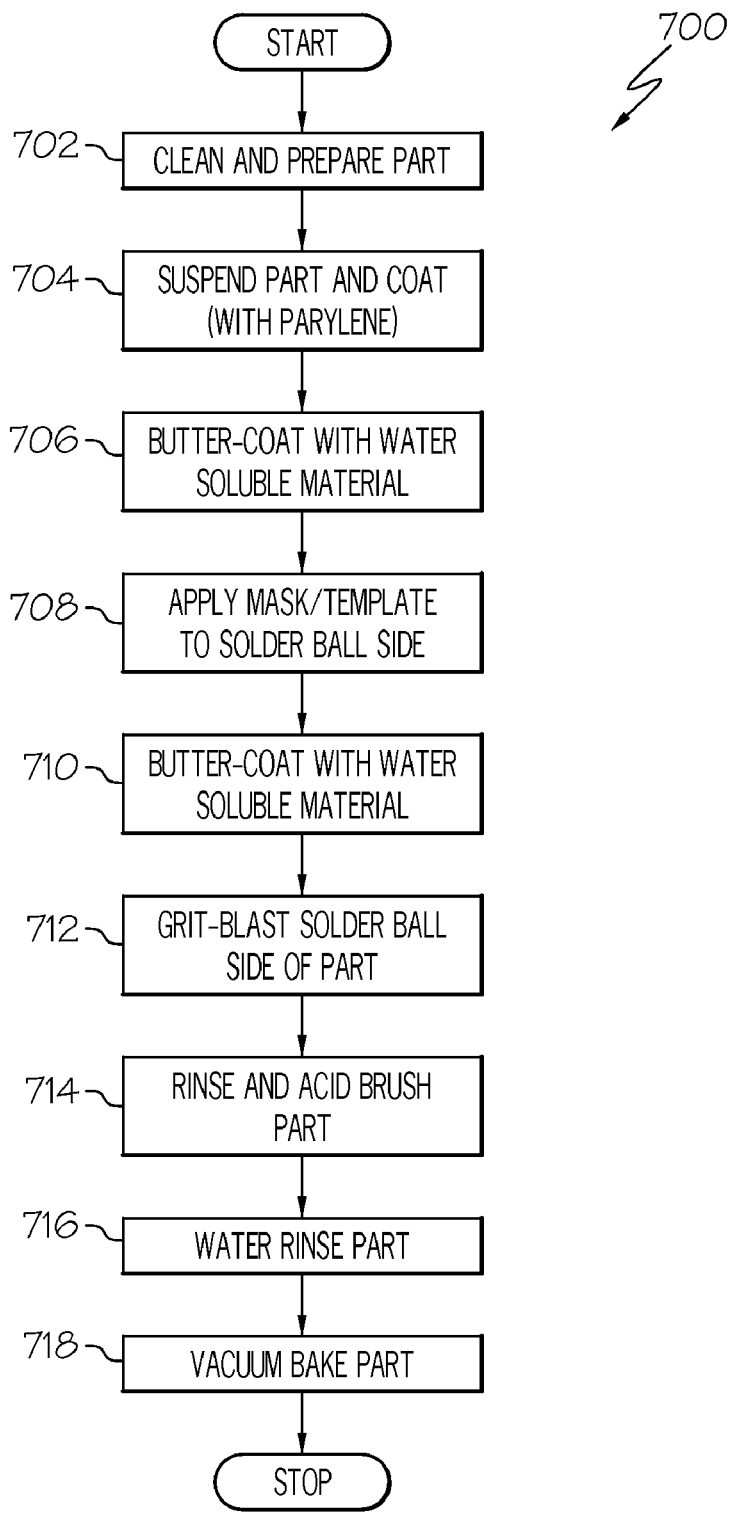
FIG. 7 depicts a process flow chart as an example method that may be used for coating and selectively exposing specific surfaces of a ball grid array surface mount package, in accordance with a preferred embodiment of the present invention.

FIG. 7 depicts a process flow chart showing an example method 700 that may be used for coating a surface mount package, in accordance with a preferred embodiment of the present invention. Referring to FIGS. 1 through 7, for this example embodiment, a surface mount package (part) is cleaned and prepared for the coating process (step 702). The part is then suspended in a suitable environment and coated (step 704). For this example embodiment, the surface mount package is a plastic ball grid array, which is suspended in a vacuum chamber and vacuum deposition coated with parylene. The thickness of the parylene coating applied is approximately 1 mil (e.g., a typical conformal coating range is between ½ mil and 2 mils). An example of such a parylene-coated part is surface mount package 100 shown in, and described above with respect to, FIG. 1. The parylene-coated portions of package 100 are identified as elements 106.

Next, for this example embodiment, the solder ball side of the parylene-coated part is "butter-smeared" or coated with a water soluble material, and the surface of the part may be squeegeed to remove any excess material (step 706). A suitable water soluble material that may be used is a liquid solder mask with adhesive properties, such as, for example, Wondermask P manufactured by TECHSPRAY of Amarillo, Tex. An example of such a water soluble-coated part is surface mount package 200 shown in, and described above with respect to, FIG. 2. The water soluble coated portions of package 200 are identified as elements 208. A mask or template including a plurality of holes arranged in substantially the same pattern as the balls in the grid is then applied to the butter-smeared surface of the part (step 708). For example, a metal mask (e.g., brass plate) including a grid-work of holes that correspond to the solder balls, and a thickness that is approximately 80% of the height of the solder balls (or columns), may be applied to the butter-smeared surface of the part. In order to account for minor irregularities in the ball-to-hole alignment, and minor differences in the sizes of the solder balls, the diameters of the holes in the mask/template are made approximately 0.005-0.010 inch larger than the diameters (on average) of the solder balls (or columns). An example of such a parylene-coated, masked, butter-smeared part is surface mount package 300 shown in, and described above with respect to, FIG. 3. The mask/template and the water soluble portions of package 300 are identified, respectively, as elements 310 and 308.

The solder ball side of the part is then butter-smeared again with the water soluble material, and the surface of the part is squeegeed again to remove any excess material (step 710). The part is then allowed to air dry. An example of such a parylene-coated, masked, butter-smeared part is surface mount package 400 shown in, and described above with respect to, FIG. 4. The mask/template and water soluble portions of package 400 are identified, respectively, as elements 410, 408 and 412. Notably, at this point in the method, approximately 80% of the height of the parylene-coated solder balls (or columns) is covered by the mask/template and the water soluble material.

For this example embodiment, the masked part is then placed in a suitable container, and the solder ball side of the part is grit blasted with an abrasive material (step 712). For example, a suitable abrasive material that can be used for grit blasting (or soda blasting) the part is Alumina ($AlO_2$) or Silicon Oxide ($SiO_2$). Notably, at this point in the method, the grit blasting has removed the parylene coating only from the unmasked, protruding or outermost 20% of the solder balls. An example of such a part in which the parylene coating has been removed (e.g., by grit blasting) from approximately 20% of the outermost portions of the solder balls is surface mount package 500 shown in, and described above with respect to, FIG. 5. The protruding, uncoated 20% areas of the solder balls (e.g., 504a-504n) of package 500 are identified as elements 514.

Next, for this example, the part may be rinsed with water (e.g., to remove the water soluble coating and the mask, and an acid brush may be used to float the mask material away from the solder balls and the part (step 714). The part may be rinsed again with water, in order to remove any remaining water soluble material (step 716). An example of such a completed part is surface mount package 600 shown in, and described above with respect to, FIG. 6. The part is parylene-coated (e.g., identified by the areas 606), except for the tips of the solder balls which are exposed (e.g., identified as elements 614). The part may then be cleaned with an alcohol solution and baked in a vacuum oven, in order to remove as much moisture from the part as possible (step 718). The baking temperature and duration depends on the type of part involved. For example, if a plastic ball grid array package is involved, the plastic part may be moisture baked at a relatively low temperature for a relatively long duration. If a ceramic column grid array package is involved, the ceramic part may be moisture baked at a relatively high temperature for a relatively short duration. Thus, in accordance with the principles of the present invention, the above-described method provides a parylene-coated surface mount package for integrated circuits, which is highly impervious to moisture, has a very high dielectric strength, and increases the electrical and thermal performance and reliability of the surface mounted part. Also, in accordance with the present invention, the parylene-coated package thus provided significantly decreases the likelihood or probability that solder bridging or particulate shorts will occur in such a part for relatively long periods of time.

The description of the present invention has been presented for purposes of illustration and description, and is not intended to be exhaustive or limited to the invention in the form disclosed. Many modifications and variations will be apparent to those of ordinary skill in the art. These embodiments were chosen and described in order to best explain the principles of the invention, the practical application, and to enable others of ordinary skill in the art to understand the invention for various embodiments with various modifications as are suited to the particular use contemplated.

What is claimed is:

1. A method for forming a surface mount package for an integrated circuit, comprising the steps of:
    vacuum depositing a conformal coating of parylene above at least one surface of the surface mount package, said at least one surface including a plurality of electrical connections arranged in a predetermined pattern;
    butter-smearing a liquid solder mask material above the conformal coating of parylene;
    affixing a template above the liquid solder mask material, the template including a plurality of holes arranged in the predetermined pattern and masking a substantial portion of each electrical connection of the plurality of electrical connections; and
    grit blasting the surface mount package so as to remove the liquid solder mask material and the conformal coating of parylene from a second portion of said each electrical connection, the second portion not including the masked substantial portion.

2. The method of claim 1, wherein the template comprises a metal template.

3. The method of claim 1, further comprising the step of butter-smearing a layer of a water soluble material above a surface of the template and the liquid solder mask material.

4. The method of claim 1, wherein the template comprises a rubber template.

5. The method of claim 1, wherein the template comprises at least one of a plastic, epoxy or composite template.

6. The method of claim 1, wherein the template comprises a ceramic template.

7. The method of claim 1, wherein the surface mount package includes at least one of a ball grid array and a column grid array.

8. The method of claim 1, wherein said second portion of said each electrical connection comprises approximately 20% of said each electrical connection.

* * * * *